United States Patent
Park et al.

(10) Patent No.: US 12,374,373 B2
(45) Date of Patent: Jul. 29, 2025

(54) BIT LINE SENSE AMPLIFIER AND BIT LINE SENSING METHOD OF SEMICONDUCTOR MEMORY DEVICE

(71) Applicant: Samsung Electronics Co., Ltd., Suwon-si (KR)

(72) Inventors: Chaehwan Park, Suwon-si (KR); Keewon Kwon, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 250 days.

(21) Appl. No.: 18/205,057

(22) Filed: Jun. 2, 2023

(65) Prior Publication Data

US 2023/0395102 A1 Dec. 7, 2023

(30) Foreign Application Priority Data

Jun. 2, 2022 (KR) .......................... 10-2022-0067698

(51) Int. Cl.
*G11C 7/08* (2006.01)
*G11C 7/10* (2006.01)
*G11C 7/12* (2006.01)

(52) U.S. Cl.
CPC ................ *G11C 7/08* (2013.01); *G11C 7/109* (2013.01); *G11C 7/12* (2013.01)

(58) Field of Classification Search
CPC .. G11C 7/08; G11C 7/109; G11C 7/12; G11C 11/4091; G11C 7/062; G11C 7/067; G11C 7/065; H03F 3/45968

USPC .......................................................... 365/191
See application file for complete search history.

(56) References Cited

U.S. PATENT DOCUMENTS

| | | | |
|---|---|---|---|
| 6,535,025 B2 | 3/2003 | Terzioglu et al. | |
| 6,822,919 B2 | 11/2004 | Sahoo | |
| 9,202,531 B2 | 12/2015 | Seo | |
| 2004/0169529 A1 | 9/2004 | Afghahi et al. | |
| 2006/0044903 A1 | 3/2006 | Forbes | |
| 2008/0192555 A1* | 8/2008 | Fort ....................... | G11C 7/067 365/207 |
| 2022/0068357 A1* | 3/2022 | Lin ...................... | G11C 11/4074 |
| 2022/0148628 A1* | 5/2022 | Ji .......................... | G11C 11/4091 |
| 2022/0270653 A1* | 8/2022 | Cao ........................... | G11C 7/12 |

* cited by examiner

*Primary Examiner* — Amir Zarabian
*Assistant Examiner* — Minh Dinh
(74) *Attorney, Agent, or Firm* — Myers Bigel, P.A.

(57) ABSTRACT

A bit line sense amplifier includes a differential amplifier configured to receive an input signal from a bit line through an input terminal of the bit line sense amplifier and output a first signal to a first node of the bit line sense amplifier, a sensing inverter configured to receive the first signal and output a second signal to a second node of the bit line sense amplifier, the second signal resulting from inverting the first signal, a first switch configured to electrically connect the second node to a positive input of the differential amplifier, a second switch configured to electrically connect the first node to the positive input of the differential amplifier, and a third switch configured to electrically connect the second node to a negative input of the differential amplifier.

20 Claims, 19 Drawing Sheets

BIT LINE SENSE AMPLIFIER AND BIT LINE SENSING METHOD OF SEMICONDUCTOR MEMORY DEVICE

CROSS-REFERENCE TO RELATED APPLICATION

This application is based on and claims priority under 35 U.S.C. § 119 to Korean Patent Application No. 10-2022-0067698, filed on Jun. 2, 2022, in the Korean Intellectual Property Office, the disclosure of which is incorporated by reference herein in its entirety.

BACKGROUND

The present disclosure relates to a bit line sensing method of a semiconductor memory device, and more particularly, to a bit line sensing method using a bit line sense amplifier.

It can be beneficial for semiconductor memory devices to have a high capacity and perform low-power high-speed operation according to user needs. With the high capacity of semiconductor memory devices, there can be loading mismatch between a bit line and a complementary bit line, which are connected to a bit line sense amplifier. There can also be threshold voltage mismatch between transistors of a bit line sense amplifier because of micro processes. Such mismatch can cause sensing efficiency, such as sensing margin or sensing speed, of a bit line sense amplifier to decrease.

SUMMARY

The inventive concept provides a bit line sense amplifier configured as a single-ended sense amplifier.

The inventive concept also provides a bit line sensing method of a bit line sense amplifier, by which a capacitance load on a signal that undergoes offset compensation is reduced by converting an input signal and continuously providing feedback of a converted signal.

According to an aspect of the inventive concept, there is provided a bit line sense amplifier including a differential amplifier configured to receive an input signal from a bit line through an input terminal of the bit line sense amplifier and output a first signal to a first node of the bit line sense amplifier, a sensing inverter configured to receive the first signal and output a second signal to a second node of the bit line sense amplifier, the second signal resulting from inverting the first signal, a first switch configured to electrically connect the second node to a positive input of the differential amplifier, a second switch configured to electrically connect the first node to the positive input of the differential amplifier, and a third switch configured to electrically connect the second node to a negative input of the differential amplifier, wherein, when the first switch is closed, the input signal is configured to be input to the negative input of the differential amplifier, the second signal is configured to be input to the positive input of the differential amplifier, and the bit line sense amplifier is configured to perform offset compensation on the first signal, based on the input signal and the second signal.

According to another aspect of the inventive concept, there is provided a bit line sensing method performed by a bit line sense amplifier including a first switch electrically connecting an output of a sensing inverter to a positive input of a differential amplifier, a second switch electrically connecting an output of the differential amplifier to the positive input of the differential amplifier, and a third switch electrically connecting the output of the sensing inverter to a negative input of the differential amplifier. The bit line sensing method includes inputting an input signal from a bit line to the differential amplifier through an input terminal of the bit line sense amplifier and outputting a first signal to a first node of the bit line sense amplifier, generating, by the sensing inverter, a second signal by inverting the first signal and outputting the second signal from the sensing inverter to a second node of the bit line sense amplifier, and inputting the input signal to the negative input of the differential amplifier, inputting the second signal to the positive input of the differential amplifier, and performing offset compensation on the first signal, based on the input signal and the second signal, while the first switch is closed.

According to a further aspect of the inventive concept, there is provided a bit line sense amplifier including a differential amplifier configured to receive an input signal from a bit line through an input terminal of the bit line sense amplifier and output a first signal to a first node of the bit line sense amplifier, a sensing inverter configured to receive the first signal and output a second signal to a second node of the bit line sense amplifier, the second signal resulting from inverting the first signal, a first switch configured to electrically connect the second node to a positive input of the differential amplifier, a second switch configured to electrically connect the first node to the positive input of the differential amplifier, a third switch configured to electrically connect the second node to a negative input of the differential amplifier, and a switch unit configured to electrically connect the input terminal to a plurality of bit lines, wherein, when the first switch is closed, the input signal is configured to be input to the negative input of the differential amplifier, the second signal is configured to be input to the positive input of the differential amplifier, and the bit line sense amplifier is configured to perform offset compensation on the first signal, based on the input signal and the second signal.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

The terms used herein are described briefly, and embodiments are described in detail.

Figure 1:
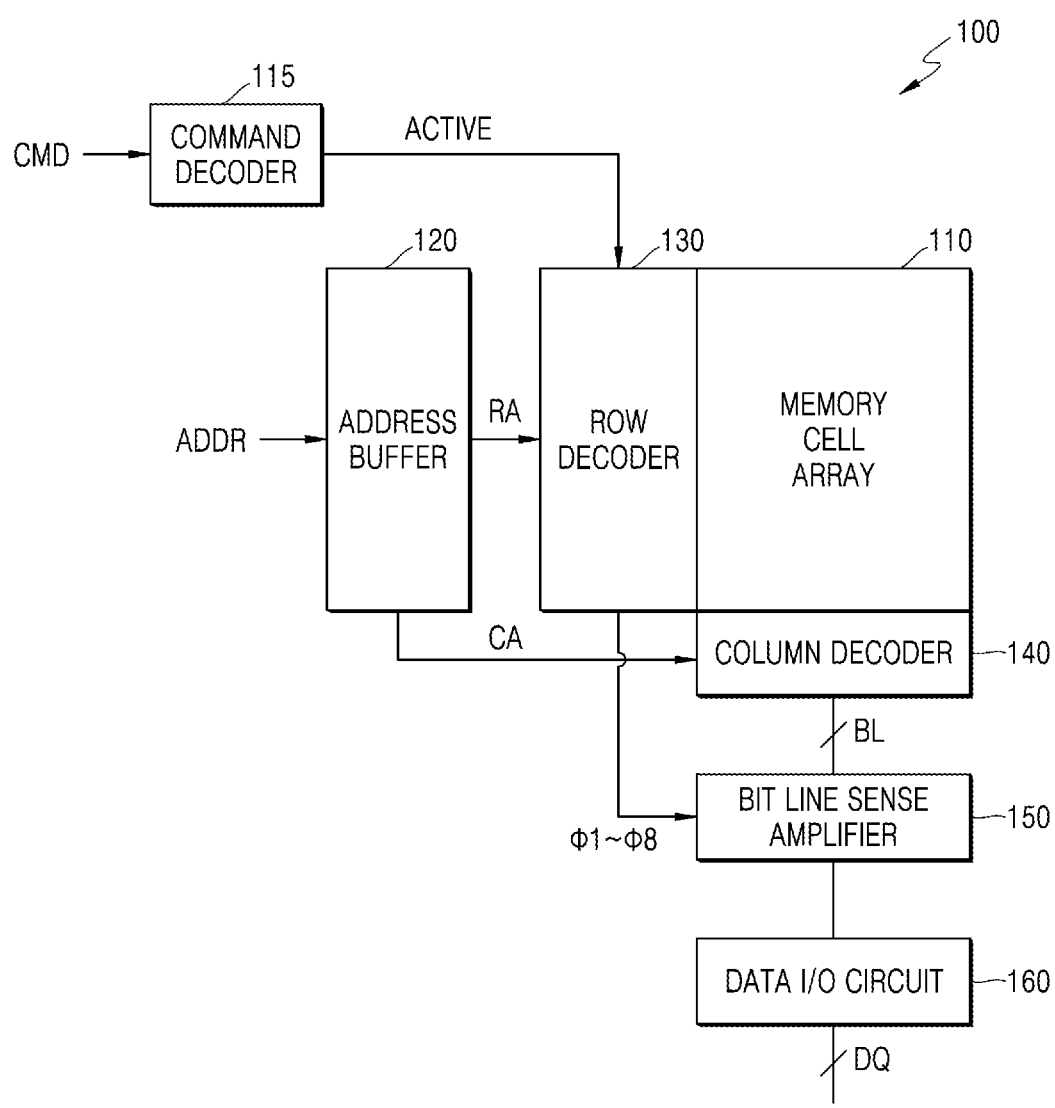
FIG. 1 is a diagram of a memory device according to an embodiment.

FIG. 1 is a diagram of a memory device 100 according to an embodiment.

Referring to FIG. 1, the memory device 100 may include a storage device based on a semiconductor device. For example, the memory device 100 may include dynamic random access memory (DRAM), such as synchronous DRAM (SDRAM), double data rate (DDR) SDRAM, low power (LP) DDR SDRAM, graphics DDR (GDDR) SDRAM, DDR2 SDRAM, DDR3 SDRAM, or DDR4 SDRAM, or a resistive memory, such as phase-change RAM (PRAM), magnetic RAM (MRAM), or resistive RAM (RRAM).

The memory device 100 may output data through data lines DQ, in response to a command CMD, an address ADDR, and control signals, which are received from an external device, e.g., a memory controller. The memory device 100 may include a memory cell array 110, a command decoder 115, an address buffer 120, a row decoder 130, a column decoder 140, a bit line sense amplifier 150, and a data input/output (I/O) circuit 160.

The memory cell array 110 may include a plurality of memory cells arranged in a matrix of rows and columns. The memory cell array 110 may include a plurality of word lines and a plurality of bit lines BL, which are connected to the memory cells. The word lines may be respectively connected to the rows of memory cells, and the bit lines BL may be respectively connected to the columns of memory cells.

The command decoder 115 may decode a write enable signal /WE, a row address strobe signal /RAS, a column address strobe signal /CAS, a chip select signal /CS, and the like, which are received from an external device, e.g., a memory controller. The command decoder 115 may generate control signals corresponding to the command CMD. The command CMD may include an active command, a read command, a write command, a precharge command, or the like. The command decoder 115 may generate an active signal ACTIVE, based on an active command.

The address buffer 120 may receive the address ADDR from an external device, e.g., a memory controller. The address ADDR may include a row address RA, which addresses a row of the memory cell array 110, and a column address CA, which addresses a column of the memory cell array 110. The address buffer 120 may transmit the row address RA to the row decoder 130 and the column address CA to the column decoder 140.

The row decoder 130 may select one of the word lines connected to the memory cell array 110. The row decoder 130 may decode the row address RA received from the address buffer 120, select a word line corresponding to the row address RA, and activate the selected word line.

The column decoder 140 may select one of the bit lines BL of the memory cell array 110. The column decoder 140 may decode the column address CA received from the address buffer 120 and select a bit line corresponding to the column address CA.

The bit line sense amplifier 150 may be connected to the bit lines BL of the memory cell array 110. The bit line sense amplifier 150 may sense a voltage change in the selected one of the bit lines BL, amplify a voltage of the selected bit line, and output an amplified voltage. The data I/O circuit 160 may output data, which is output from the bit line sense amplifier 150 based on the sensed and amplified voltage, to the outside through the data lines DQ.

The bit line sense amplifier 150 may receive switch signals Φ1 to Φ8 from the row decoder 130. The switch signals Φ1 to Φ8 may be provided by the row decoder 130, which responds to the active signal ACTIVE from the command decoder 115, and is selectively activated when a word line drive voltage is applied to a word line corresponding to the row address RA.

The switch signals Φ1 to Φ8 may control a plurality of switches included in the bit line sense amplifier 150. When the switches are turned on or off by the switch signals Φ1 to Φ8, the bit line sense amplifier 150 may perform a precharge operation, an offset removing operation, a charge sharing operation, and/or a sensing and restoring operation. The bit line sense amplifier 150, which operates based on the switching operations of the switches according to the switch signals Φ1 to Φ8, may be referred to as a switchable bit line sense amplifier.

The configuration and operation of the bit line sense amplifier 150 are described below in detail through various embodiments.

Figure 2:
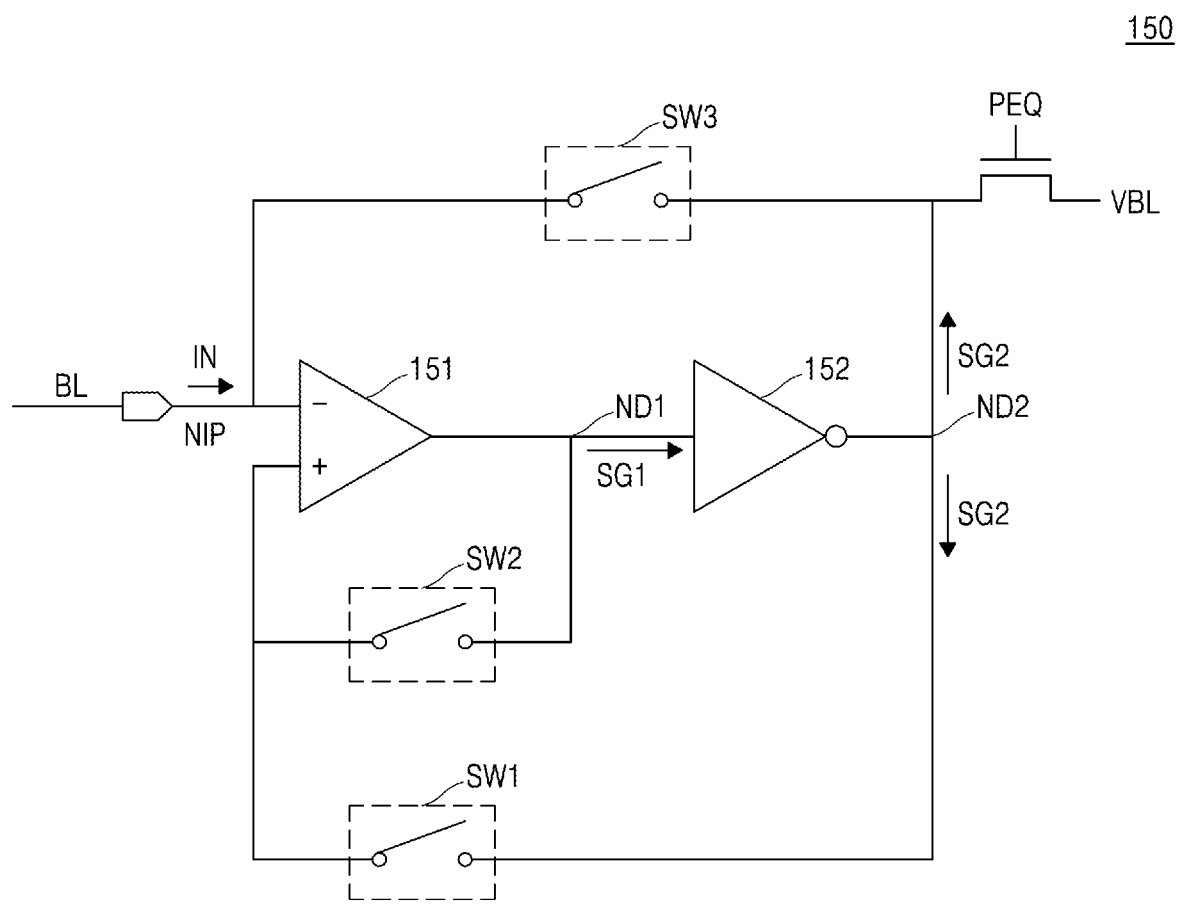
FIG. 2 is a circuit diagram of a bit line sense amplifier according to an embodiment.
Figure 3:
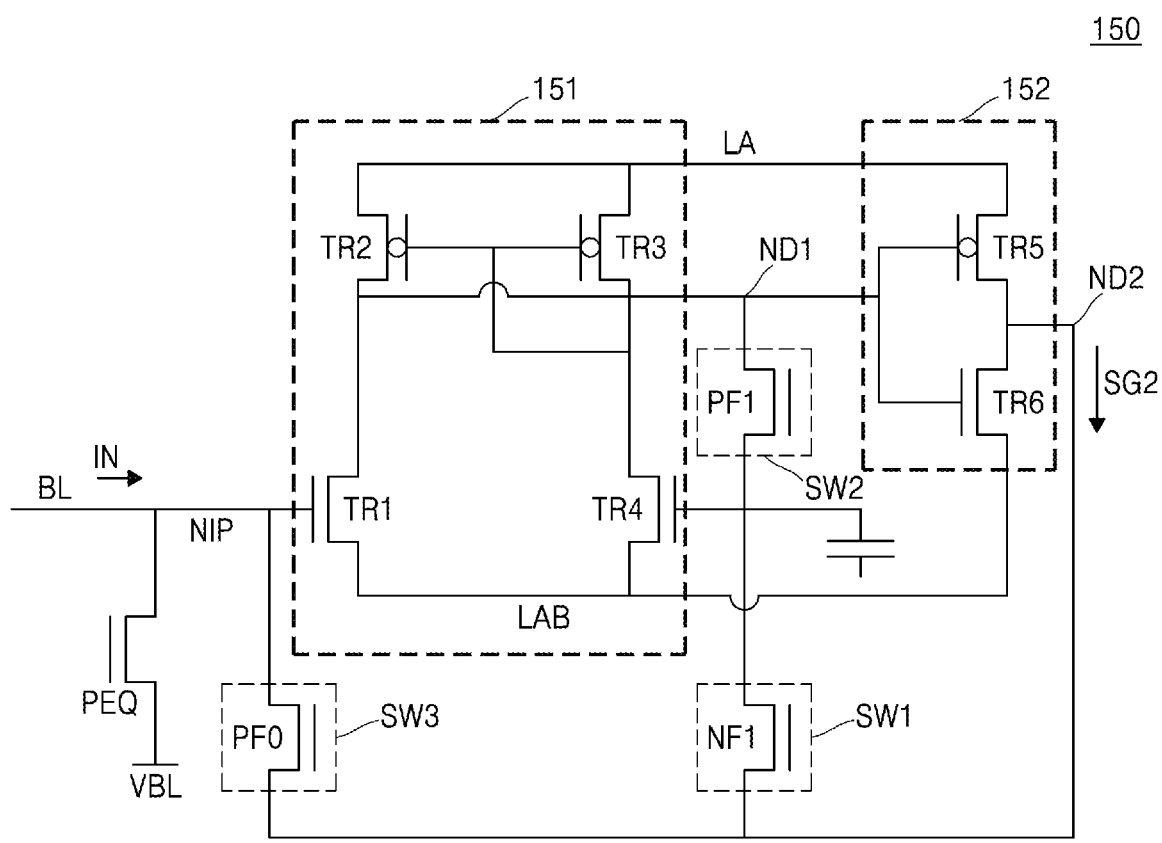
FIG. 3 is a detailed circuit diagram of a bit line sense amplifier according to an embodiment.

FIG. 2 is a circuit diagram of the bit line sense amplifier 150 according to an embodiment, and FIG. 3 is a detailed circuit diagram of the bit line sense amplifier 150 according to an embodiment.

Referring to FIG. 2, the bit line sense amplifier 150 may include a differential amplifier 151, a sensing inverter 152, a first switch SW1 connecting an output of the sensing inverter 152 to a positive input of the differential amplifier 151, a second switch SW2 connecting an output of the differential amplifier 151 to the positive input of the differential amplifier 151, and a third switch SW3 connecting the output of the sensing inverter 152 to a negative input of the differential amplifier 151.

The bit line sense amplifier 150 may receive an input signal IN from a bit line BL through an input terminal NIP. The differential amplifier 151 may be connected to the sensing inverter 152 through a first node ND1, and the sensing inverter 152 may output a signal to a second node ND2. Hereinafter, the output signal of the differential amplifier 151 is defined as a first signal SG1, and the output signal of the sensing inverter 152 is defined as a second signal SG2. According to an embodiment, the bit line sense amplifier 150 may further include a fourth switch PEQ for a precharge operation. The fourth switch PEQ may control the input of a signal of a precharge voltage VBL.

Referring to FIGS. 2 and 3, the differential amplifier 151 may include a plurality of transistors, e.g., first to fourth transistors TR1, TR2, TR3, and TR4. The first transistor TR1 may correspond to the negative input terminal of the differential amplifier 151. The fourth transistor TR4 may correspond to the positive input terminal of the differential amplifier 151. The positive terminal (i.e., positive input) of the differential amplifier 151 may be a non-inverting input terminal, and the negative terminal (i.e., negative input) of the differential amplifier 151 may be an inverting input terminal. The differential amplifier 151 may receive the input signal IN through the input terminal NIP and receive the first signal SG1 or the second signal SG2. Here, the input signal IN may be input as the negative input of the differential amplifier 151, and the first or second signal SG1 or SG2 may be input as the positive input of the differential amplifier 151. The differential amplifier 151 may output the first signal SG1 to the first node ND1, based on the input signal IN, the first signal SG1, and/or the second signal SG2. For example, the differential amplifier 151 may receive the input signal IN as a positive input and the first or second signal SG1 or SG2 as a negative input and newly output the first signal SG1, based on the input signal IN and the first or second signal SG1 or SG2, thereby performing feedback of the first signal SG1. As described below, when feedback of the first signal SG1 is performed, an offset of the first signal SG1 may be corrected. Because the capacitance load of the first signal SG1 that has undergone the offset compensation is less than the capacitance load of the input signal IN, offset compensation may be relatively quickly performed and free from distribution of capacitance load. Offset compensation performed by the bit line sense amplifier 150, according to an embodiment, is described in detail with reference to FIGS. 4 and 5.

Referring to FIGS. 2 and 3, the sensing inverter 152 may include a plurality of transistors TR5 and TR6. The sensing inverter 152 may receive and convert the first signal SG1 and output the second signal SG2 to the second node ND2. The sensing inverter 152 may generate the second signal SG2 by inverting the first signal SG1. For example, when offset compensation is not performed on the first signal SG1, the value of the first signal SG1 may be higher than when offset compensation is performed on the first signal SG1. When the sensing inverter 152 may output the second signal SG2 resulting from inverting the first signal SG1 that has a relatively high value and the second signal SG2 is used as a positive input of the differential amplifier 151, the magnitude of the first signal SG1 output by the differential amplifier 151 may decrease. The sensing inverter 152 may be connected to an output of the differential amplifier 151 through the first node ND1 and connected to an input of the differential amplifier 151 according to the operation of the first or third switch SW1 or SW3. Here, the first switch SW1 may correspond to a negative feedback transistor NF1, the second switch SW2 may correspond to a first positive feedback transistor PF1, and the third switch SW3 may correspond to a second positive feedback transistor PF0. For convenience of description, the negative feedback transistor NF1 and the first and second positive feedback transistors PF1 and PF0 are respectively referred to as the first to third switches SW1, SW2, and SW3 below.

The first switch SW1 may connect the output of the sensing inverter 152 to the positive input of the differential amplifier 151. For example, according to an embodiment, when the bit line sense amplifier 150 performs offset compensation on the first signal SG1, the first switch SW1 may be closed, and the second signal SG2 may be used as the positive input of the differential amplifier 151.

The second switch SW2 may connect the output of the differential amplifier 151 to the positive input of the differential amplifier 151. For example, according to an embodiment, when the bit line sense amplifier 150 performs a sensing operation, the second switch SW2 may be closed, and the first signal SG1 may be used as the positive input of the differential amplifier 151. As a result, the differential amplifier 151 may perform a bit line sensing operation, based on the input signal IN and the first signal SG1. For example, when the second switch SW2 is closed, the bit line sense amplifier 150 may perform a bit line sensing operation based on an output of the differential amplifier (i.e., SG1).

The third switch SW3 may connect the output of the sensing inverter 152 to the negative input of the differential amplifier 151. For example, according to an embodiment, when the bit line sense amplifier 150 performs restoration, the third switch SW3 may be closed, and the second signal SG2 may be used as the negative input of the differential amplifier 151.

The bit line sense amplifier 150 may further include the fourth switch PEQ, which determines supply of the precharge voltage VBL from an external power supply. The fourth switch PEQ may connect an external power supply to the input terminal NIP. When the fourth switch PEQ is closed, the bit line sense amplifier 150 may be provided (i.e., supplied) with the precharge voltage VBL and may perform a precharge operation.

The bit line sense amplifier 150 may be provided with a voltage through a first power supply line LA and a second power supply line LAB. For example, the precharge voltage VBL may be provided to the first and second power supply lines LA and LAB.

Figure 4:
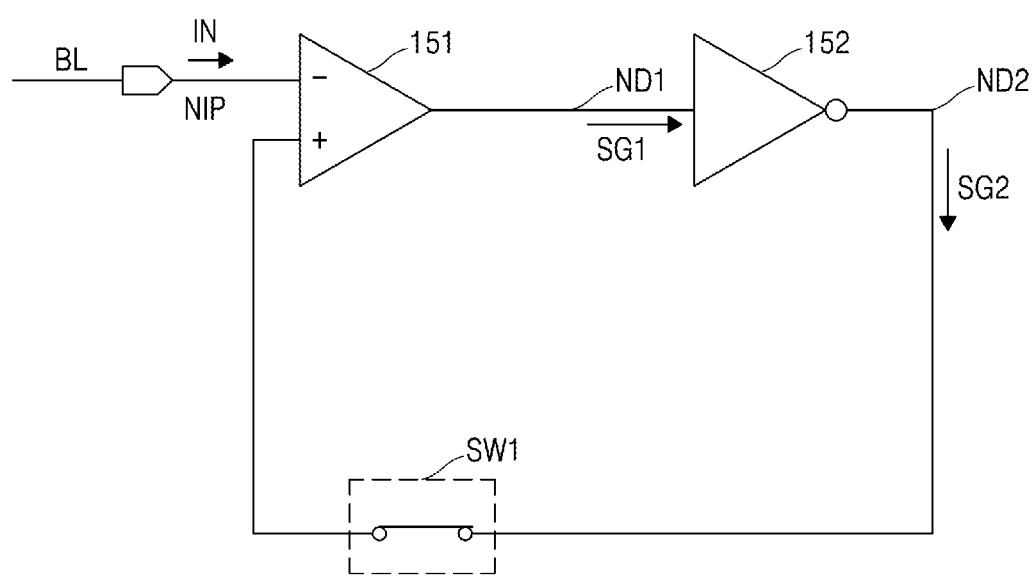
FIG. 4 is a circuit diagram of a bit line sense amplifier that performs offset compensation, according to an embodiment.
Figure 5:
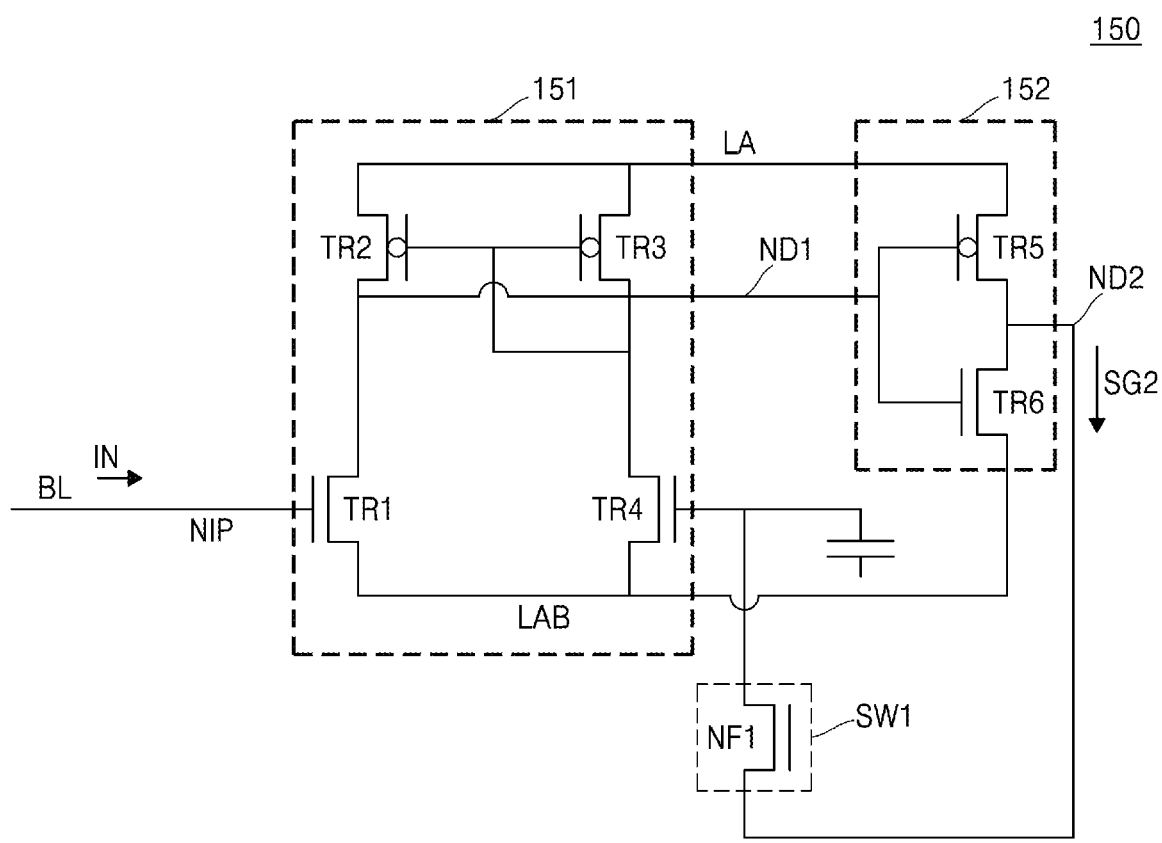
FIG. 5 is a detailed circuit diagram of a bit line sense amplifier that performs offset compensation, according to an embodiment.

FIG. 4 is a circuit diagram of the bit line sense amplifier 150 that performs offset compensation, according to an embodiment. FIG. 5 is a detailed circuit diagram of the bit line sense amplifier 150 that performs offset compensation, according to an embodiment.

Referring to FIGS. 4 and 5, according to an embodiment, when the bit line sense amplifier 150 performs offset compensation, the first switch SW1 is closed and the second and third switches SW2 and SW3 are opened. When the first switch SW1 is closed and the second and third switches SW2 and SW3 are opened, negative feedback of the first signal SG1 may be performed, and the intensity of the first signal SG1 may be adjusted. For example, when the input signal IN from the bit line BL is input to the differential amplifier 151 through the input terminal NIP, the differential amplifier 151 may output the first signal SG1 to the first node ND1. Here, the capacitance load of the input signal IN may be greater than the capacitance load of the first signal SG1. The first signal SG1 output from the differential amplifier 151 may be input to the sensing inverter 152. When the first signal SG1 is input to the sensing inverter 152, the sensing inverter 152 may invert the first signal SG1 and output the second signal SG2 to the second node ND2. At this time, because the first switch SW1 is closed, the second signal SG2 may be input to the positive input terminal of the differential amplifier 151. When the second signal SG2 is input to the differential amplifier 151, the differential amplifier 151 may newly generate the first signal SG1. Through the procedure described above, the differential amplifier 151 may perform negative feedback that reduces the value of the first signal SG1. Because the value of the first signal SG1 is reduced, the capacitance load of the first signal SG1 may decrease, and accordingly, the bit line sense amplifier 150 may carry out the offset compensation.

Referring to FIG. 5, according to an embodiment, when the bit line sense amplifier 150 performs offset compensation, the input signal IN may be input to the first transistor TR1 of the differential amplifier 151, and the second signal SG2 may be input to the fourth transistor TR4 through the first switch SW1. The differential amplifier 151 may compare the input signal IN with the second signal SG2 and output the first signal SG1 to the first node ND1.

At this time, a voltage may be continuously provided through the first and second power supply lines LA and LAB.

Figure 6:
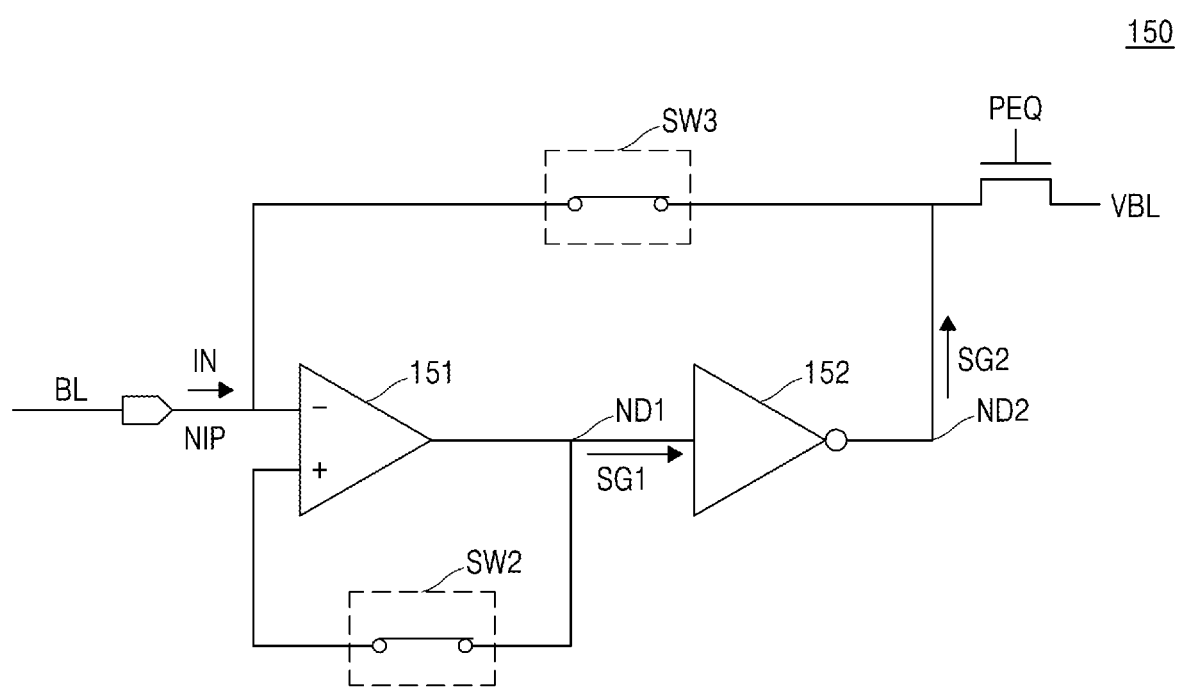
FIG. 6 is a circuit diagram of a bit line sense amplifier that has completed a sensing operation, according to an embodiment.
Figure 7:
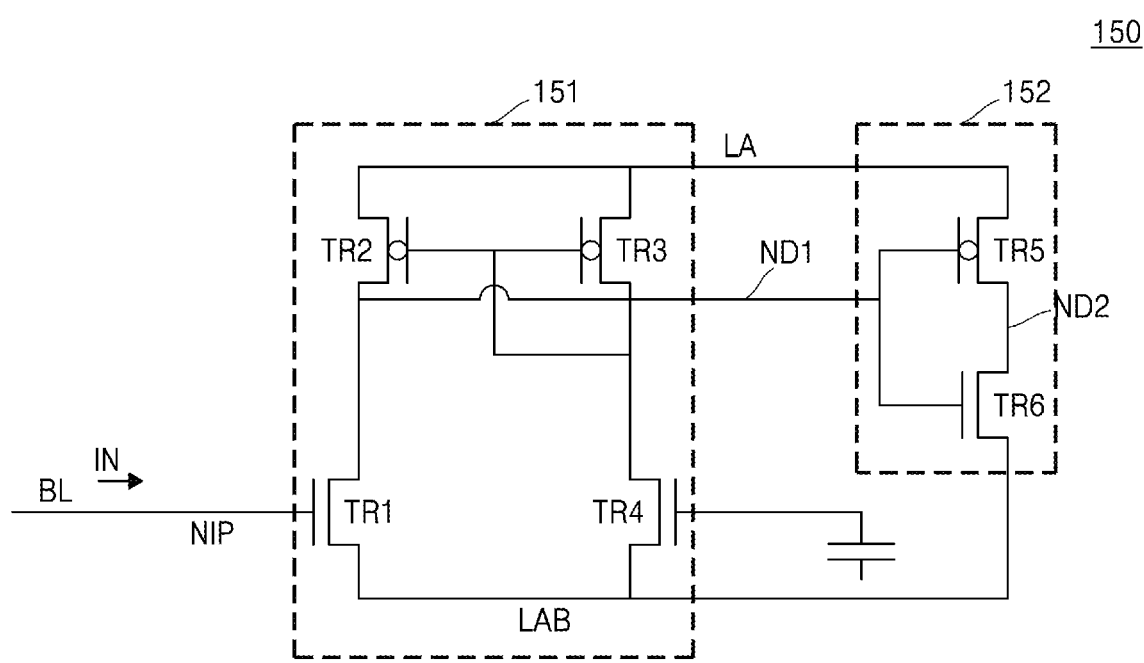
FIG. 7 is a circuit diagram of a bit line sense amplifier that performs charge sharing, according to an embodiment.

FIG. 6 is a circuit diagram of the bit line sense amplifier 150 that completes charge sharing and sensing operations and performs restoration, according to an embodiment. FIG. 7 is a circuit diagram of the bit line sense amplifier 150 starting charge sharing and sensing operations, according to an embodiment.

Referring to FIGS. 6 and 7, the first to third switches SW1, SW2, and SW3 may all be opened when the bit line sense amplifier 150 starts charge sharing and sensing operations. When the bit line sense amplifier 150 performs restoration after completing the charge sharing operation and the bit line sensing operation, the first switch SW1 may be opened and the second and third switches SW2 and SW3 may be closed.

Referring to FIG. 7, when the sensing operation is started, the first to third switches SW1, SW2, and SW3 may all be opened, and only the input signal IN may be input to the first transistor TR1. Referring back to FIG. 6, after the charge sharing and bit line sensing operations are completed, the second and third switches SW2 and SW3 may be closed. The second and third switches SW2 and SW3 may be closed at different times.

For example, when the bit line sense amplifier 150 starts a bit line sensing operation, the first to third switches SW1, SW2, and SW3 may all be opened. When the first to third switches SW1, SW2, and SW3 are all opened and a word line transits (i.e., transitions) to an on-state, a charge sharing operation may be performed on the bit line BL and the bit line sense amplifier 150 may perform the bit line sensing operation. At this time, the differential amplifier 151 may perform a bit line sensing operation, based on the characteristics of a single-ended differential amplifier. For example, as the bit line sensing operation is performed, the second switch SW2 may be closed, and the differential amplifier 151 may compare the first signal SG1 with the input signal IN and sense data of a memory cell, based on whether an output greater than a certain threshold value is generated. At this time, the fourth switch PEQ may be opened.

When the bit line sensing operation is completed, the third and second switches SW3 and SW2 may be sequentially closed, and memory cell restoration may be performed. According to an embodiment, the bit line sense amplifier 150 may carry out restoration by performing a first feedback operation and a second feedback operation after a sensing operation. The first feedback operation and the second feedback operation are described in detail with reference to FIGS. 8 and 9.

Figure 8:
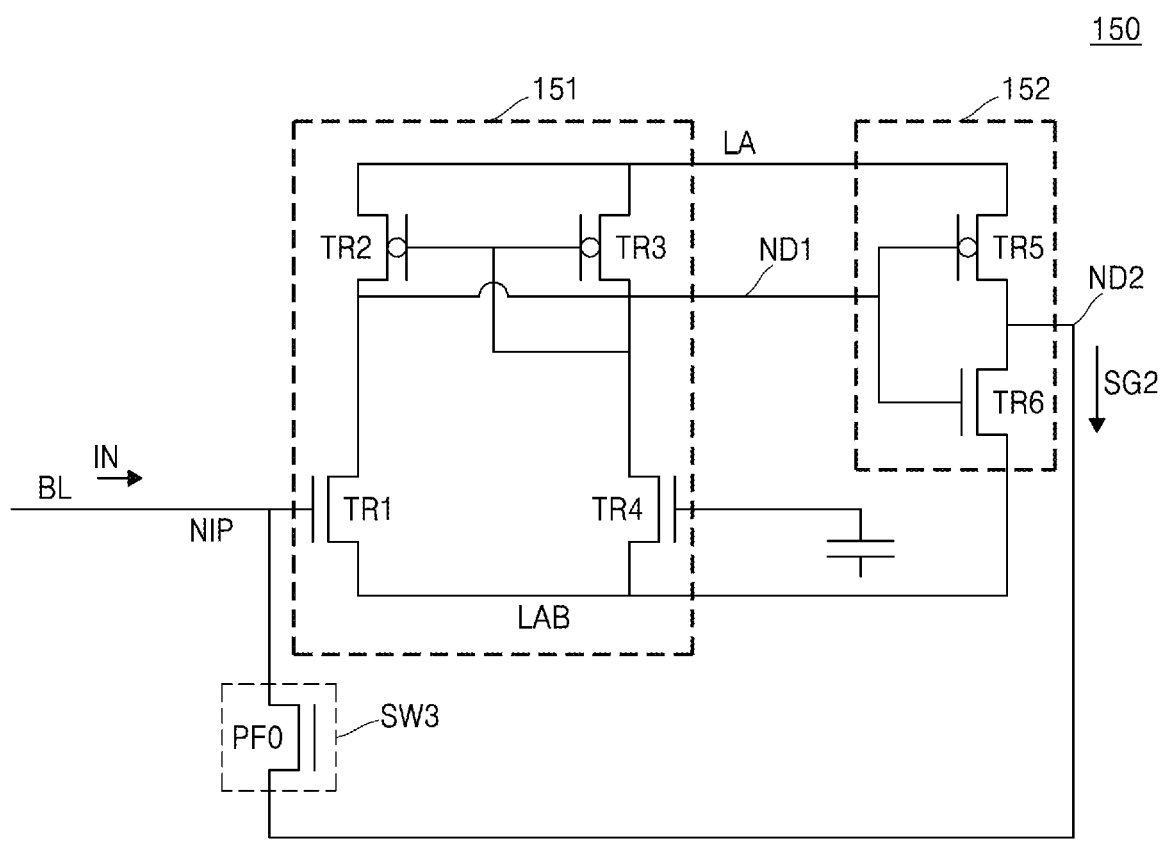
FIG. 8 is a circuit diagram of a bit line sense amplifier that performs a first feedback operation, according to an embodiment.

FIG. 8 is a circuit diagram of the bit line sense amplifier 150 that performs a first feedback operation, according to an embodiment.

Referring to FIG. 8, when the bit line sense amplifier 150 performs the first feedback operation, the third switch SW3 may be closed. When the third switch SW3 is closed, the second signal SG2 may be used as the negative input of the differential amplifier 151. When the second signal SG2 is used as the negative input of the differential amplifier 151, pull-up current may be applied to the input signal IN. In other words, the magnitude of a signal input as the negative input of the differential amplifier 151 may increase, and accordingly, the magnitude of the first signal SG1 may also increase. According to the present embodiment, the bit line sense amplifier 150 may perform positive feedback, which increases the magnitude of the first signal SG1, through the procedure described with reference to FIG. 8. Accordingly, the first feedback operation may correspond to a positive feedback operation that increases the magnitude of the first signal SG1.

Figure 9:
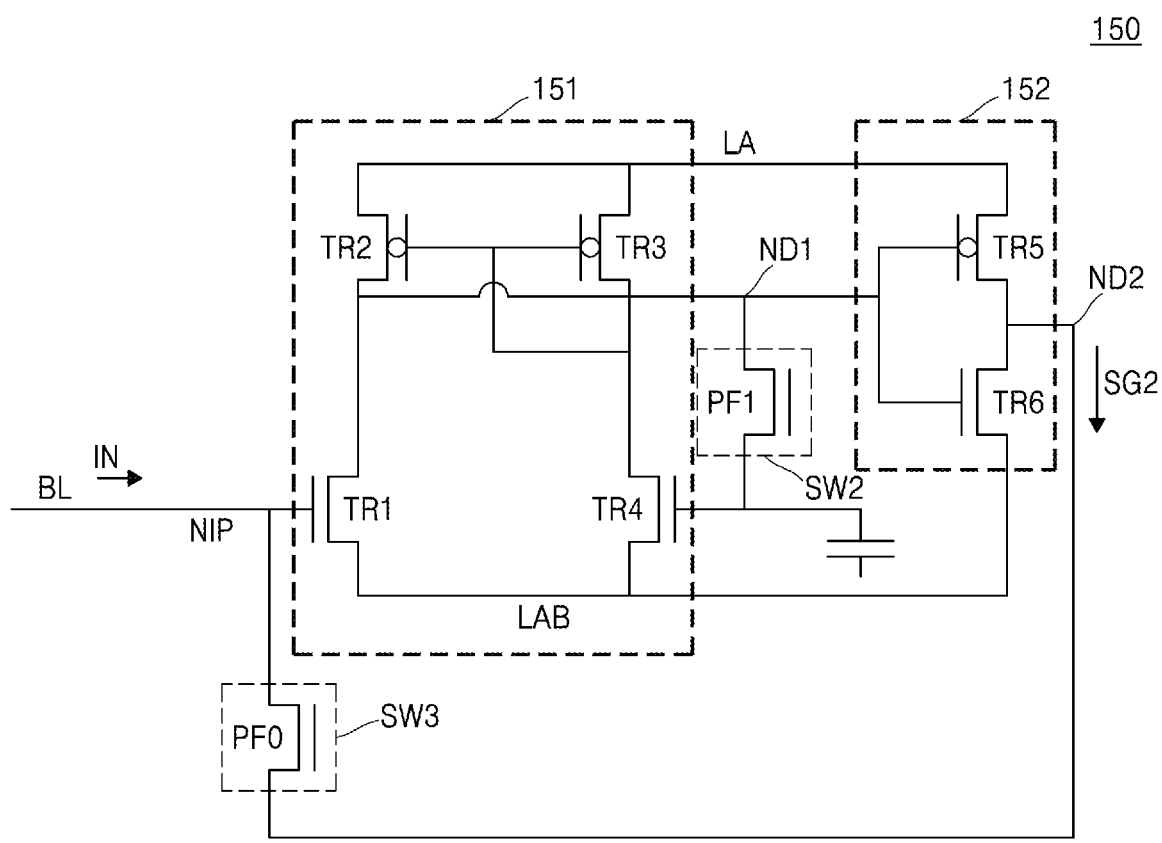
FIG. 9 is a circuit diagram of a bit line sense amplifier that performs a second feedback operation, according to an embodiment.

FIG. 9 is a circuit diagram of the bit line sense amplifier 150 that performs a second feedback operation, according to an embodiment.

Referring to FIG. 9, when the bit line sense amplifier 150 performs the second feedback operation, the second and third switches SW2 and SW3 may be closed. When the second and third switches SW2 and SW3 are closed, the first signal SG1 may be the positive input of the differential amplifier 151, and the second signal SG2 may be the negative input of the differential amplifier 151. When the first signal SG1 is the positive input of the differential amplifier 151 and the second signal SG2 is the negative input of the differential amplifier 151, pull-up current may be applied to the input signal IN. In other words, the magnitude of the first signal SG1, i.e., an output signal of the differential amplifier 151, may increase. According to the present embodiment, the bit line sense amplifier 150 may perform positive feedback, which increases the magnitude of the first signal SG1, through the procedure described with reference to FIG. 9. Accordingly, the second feedback operation may correspond to a positive feedback operation that increases the magnitude of the first signal SG1.

Figure 10:
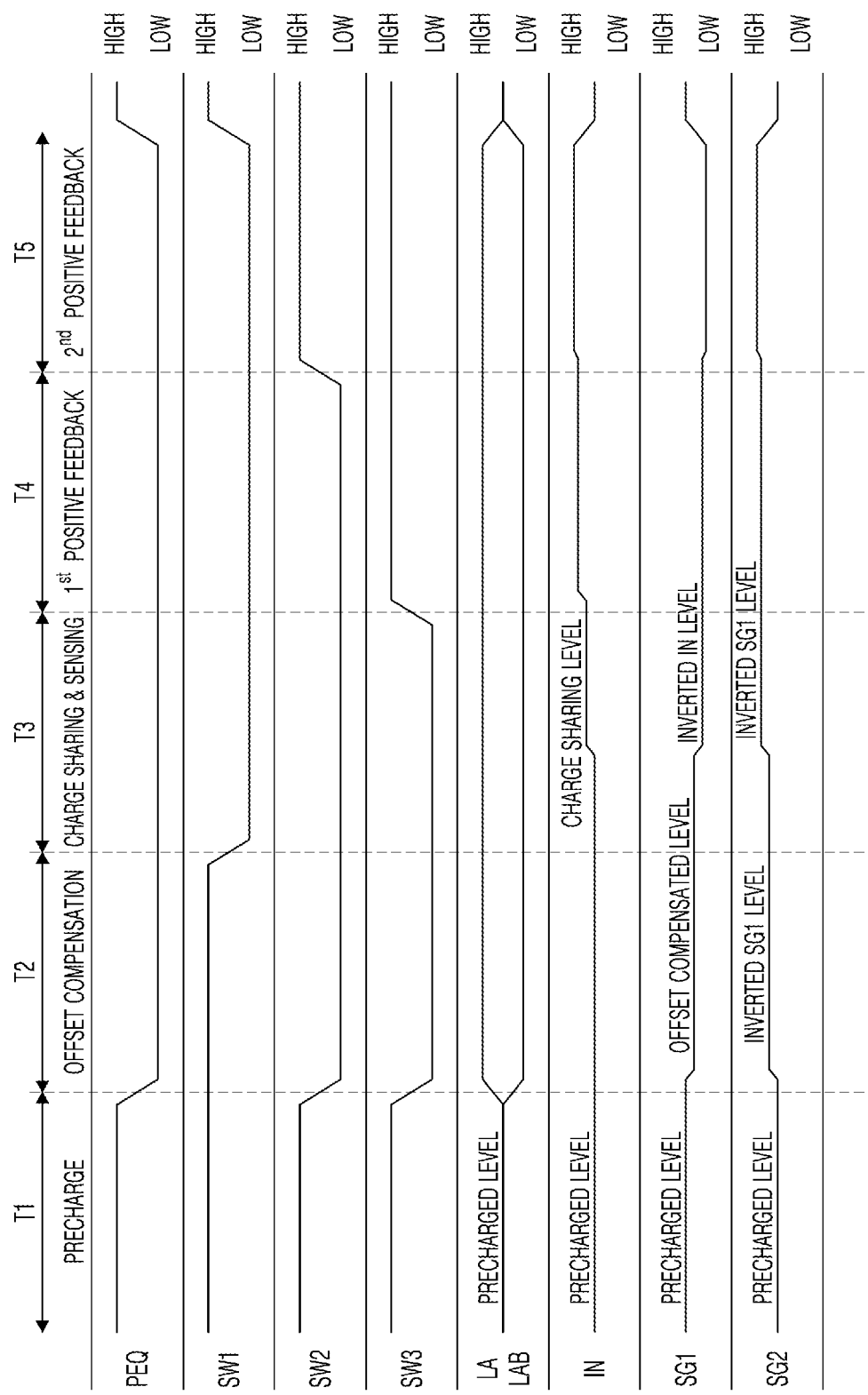
FIG. 10 is a timing diagram illustrating a bit line sensing method according to an embodiment.

FIG. 10 is a timing diagram illustrating a bit line sensing method according to an embodiment.

Referring to FIG. 10, the bit line sense amplifier 150 may carry out a bit line sensing operation through first to fifth periods T1 to T5.

According to the present embodiment, the first period T1 may correspond to a precharge period, the second period T2 may correspond to an offset compensation period, the third period T3 may correspond to a charge sharing and sensing period, the fourth period T4 may correspond to a first feedback period, and the fifth period T5 may correspond to a second feedback period. The third period T3 may include a period, in which the connection relationship between the first output node ND1 of the differential amplifier 151 and the second output node ND2 of the sensing inverter 152 is changed and charge sharing is waited for, before the charge sharing. The first to fifth periods T1 to T5 may be continuously repeated according to the operation of the bit line sense amplifier 150.

In the first period T1, a precharge control signal applied to the fourth switch PEQ may be activated, and the bit line BL may be precharged to a predetermined precharge voltage. For example, the precharge control signal may be in a logic high state. At this time, the first to fourth switches SW1, SW2, SW3, and PEQ may be closed. A voltage of the first power supply line LA may be the same as a voltage of the second power supply line LAB. For example, both the voltage of the first power supply line LA and the voltage of the second power supply line LAB may be at a precharged level. After the first period T1, the precharge voltage VBL may be a precharge control signal. The precharge control signal VBL may be inactivated, and a signal applied to the fourth switch PEQ may also be inactivated. For example, the precharge control signal VBL may be in a logic low state.

In the second period T2, the input signal IN may be maintained constant and input to the differential amplifier 151. At this time, the first switch SW1 may be closed, and the second to fourth switches SW2, SW3, and PEQ may be opened. When the input signal IN is input from the bit line BL to the differential amplifier 151, the first signal SG1 may be output from the differential amplifier 151. When the first signal SG1 is input to the sensing inverter 152, the second signal SG2 may be output. At this time, the voltage of the first power supply line LA may be different from the voltage of the second power supply line LAB. For example, the state of the first power supply line LA may be in a logic high state, and the state of the second power supply line LAB may be in a logic low state. When offset compensation is performed on the first signal SG1, the input signal IN may be input to the differential amplifier 151 as a negative input, and the second signal SG2 may be input to the differential amplifier 151 as a positive input. As a result, the differential amplifier 151 may output an output signal OUT (i.e., SG1) according to a change in the second signal SG2, and offset compensation may be performed on the first signal SG1 through feedback of the second signal SG2.

In the third period T3, the input signal IN may be maintained constant and input to the differential amplifier 151. At the start of the third period T3, the first to third switches SW1, SW2, and SW3 are all opened. In other words, at the start of the third period T3, signals respectively applied to the first to third switches SW1, SW2, and SW3 may all be in a logic low state. At this time, the voltage of the first power supply line LA may be different from the voltage of the second power supply line LAB. For example, the state of the first power supply line LA may be in a logic high state, and the state of the second power supply line LAB may be in a logic low state.

In the third period T3, when the first to third switches SW1, SW2, and SW3 are all opened and an external word line transits to an on-state, the input signal IN may transit (i.e., transition) from a precharged level to a charge-sharing level. When the input signal IN transits to the charge-sharing level, the first signal SG1 may have a level, i.e., an inverted IN level, which is obtained when the differential amplifier 151 inverts the input signal IN, and accordingly, the second signal SG2 may have a level, i.e., an inverted SG1 level, which is obtained when the first signal SG1 is inverted by the sensing inverter 152. In some embodiments, when the bit line sense amplifier 150 performs a sensing operation, for example, the second switch SW2 may be closed (i.e., in a logic high state), and the first signal SG1 may be used as the positive input of the differential amplifier 151. As a result, the differential amplifier 151 may perform a bit line sensing operation, based on the input signal IN and the first signal SG1 (i.e., an output of the differential amplifier 151).

In the fourth period T4, the third switch SW3 may be closed and the first, second, and fourth switches SW1, SW2, and PEQ may be opened. Accordingly, a voltage applied to the third switch SW3 may be in a logic high state. At this time, the voltage of the first power supply line LA may be different from the voltage of the second power supply line LAB. For example, the state of the first power supply line LA may be in a logic high state, and the state of the second power supply line LAB may be in a logic low state. When the first and second switches SW1 and SW2 are opened and the third switch SW3 is closed, the input signal IN may transit from the charge sharing level to a logic high state. When the input signal IN transits to the logic high state, the first signal SG1 may be brought to a logic low state by the differential amplifier 151. As a result, the second signal SG2 may be brought to a logic high state by the sensing inverter 152. Through the operation of the fourth period T4, the input terminal NIP may be connected to the second node ND2, and the input signal IN and the second signal SG2 may complementarily act on each other. When the first feedback operation is performed on the first signal SG1 in the fourth period T4, restoration of the state of a memory cell may start.

In the fifth period T5, the second feedback operation is performed on the first signal SG1, and the restoration of the state of the memory cell may be completed. In the fifth period T5, the second and third switches SW2 and SW3 may be closed, and first and fourth switches SW1 and PEQ may be opened. Accordingly, a voltage applied to the second switch SW2 and a voltage applied to the third switch SW3 may be in a logic high state. In addition, the voltage of the first power supply line LA may be different from the voltage of the second power supply line LAB. For example, the state of the first power supply line LA may be in a logic high state, and the state of the second power supply line LAB may be in a logic low state. When the first and fourth switches SW1 and PEQ are opened and the second and third switches SW2 and SW3 are closed, the input signal IN may be maintained in a logic high state. When the input signal IN is maintained in a logic high state, the first signal SG1 may be brought to a logic low state by the differential amplifier 151. As a result, the second signal SG2 may be brought to a logic high state by the sensing inverter 152. Through the operation of the fifth period T5, the input terminal NIP may be connected to the first node ND1 and the second node ND2, and the input signal IN, the first signal SG1, and the second signal SG2 may complementarily act on one other. In addition, when the second feedback operation is performed on the first signal SG1 in the fifth period T5, the restoration of the state of the memory cell may be completed.

Figure 11:
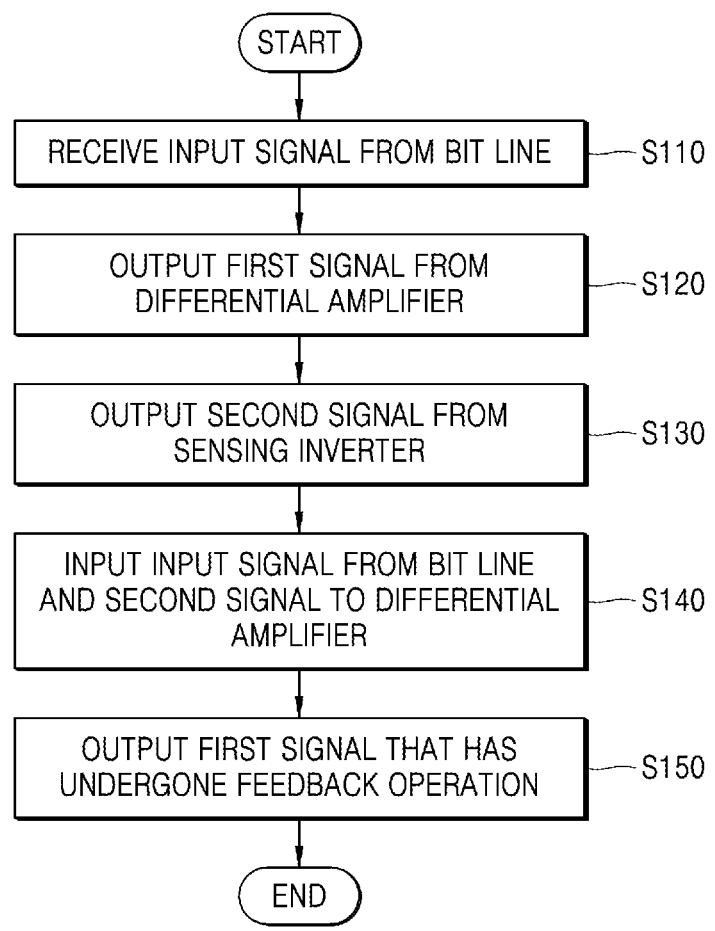
FIG. 11 is a flowchart of a bit line sensing method according to an embodiment.

FIG. 11 is a flowchart of a bit line sensing method according to an embodiment.

Referring to FIG. 11, according to an embodiment, the input signal IN is input from the bit line BL to the bit line sense amplifier 150 in operation S110. The input signal IN may be input to the differential amplifier 151 through the input terminal NIP.

When the input signal IN is input to the differential amplifier 151 of the bit line sense amplifier 150, the first signal SG1 may be output from the differential amplifier 151 in operation S120. At this time, the first signal SG1 may result from inverting the input signal IN. In addition, the capacitance load of the first signal SG1 may be less than the capacitance load of the input signal IN.

When the first signal SG1 is output from the differential amplifier 151, the second signal SG2 may be output from the sensing inverter 152 in operation S130. The second signal SG2 may result from inverting the first signal SG1. The sensing inverter 152 may have a characteristic of a NOT gate in a logic circuit.

When the second signal SG2 is output from the sensing inverter 152, the input signal IN from the bit line BL and the second signal SG2 may be input to the differential amplifier 151 in operation S140. When the input signal IN from the bit line BL and the second signal SG2 are input to the differential amplifier 151, the differential amplifier 151 may perform a feedback operation on the first signal SG1, based on the second signal SG2. For example, when the first switch SW1 is closed and the second signal SG2 is input to the differential amplifier 151, the differential amplifier 151 may compare the input signal IN with the second signal SG2 and output the first signal SG1. Here, the first signal SG1 may be newly input to the sensing inverter 152. At this time, when the first signal SG1 is not sufficient for a sensing operation, the sensing inverter 152 may generate the second signal SG2 by inverting the first signal SG1, and the second signal SG2 may be newly input to the differential amplifier 151.

The differential amplifier 151 may output the first signal SG1, which has undergone a feedback operation, in operation S150. Operations S110 to S140 may be repeatedly performed. Through the method described above, the differential amplifier 151 may, for example, perform negative feedback that reduces the value of the first signal SG1. Because the value of the first signal SG1 is reduced, the capacitance load of the first signal SG1 may decrease, and accordingly, the bit line sense amplifier 150 may carry out the offset compensation.

Figure 12:
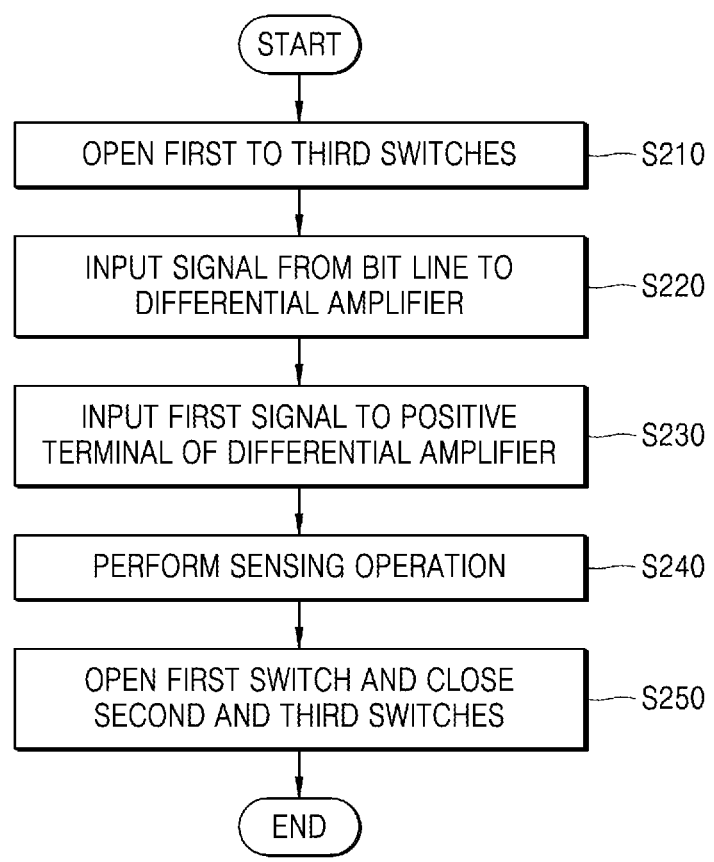
FIG. 12 is a flowchart of a bit line sensing operation according to an embodiment.

FIG. 12 is a flowchart of a bit line sensing operation according to an embodiment.

Referring to FIG. 12, to perform the bit line sensing operation, the bit line sense amplifier 150 may open the first to third switches SW1, SW2, and SW3 in operation S210. When the first to third switches SW1, SW2, and SW3 are opened at the start of the bit line sensing operation, the input signal IN from the bit line BL may be input to the differential amplifier 151 in operation S220. For example, when the input signal IN is input to the differential amplifier 151, the first signal SG1 may be output from the differential amplifier 151.

When the input signal IN is input to the differential amplifier 151, the first signal SG1 may be input to a positive terminal of the differential amplifier 151 in operation S230. For example, according to an embodiment, when the bit line sense amplifier 150 performs a sensing operation, the second switch SW2 may be closed, and the first signal SG1 may be used as the positive input of the differential amplifier 151. When the first signal SG1 is input to the differential amplifier 151, the bit line sense amplifier 150 may perform a sensing operation in operation S240. Here, the differential amplifier 151 may perform the sensing operation, based on the characteristics of a single-ended differential amplifier. For example, as the sensing operation is performed, the second switch SW2 may be closed, and the differential amplifier 151 may compare the first signal SG1 with the input signal IN and sense data of a memory cell, based on whether an output greater than a certain threshold value is generated.

When the sensing operation is completed, the first switch SW1 may be opened and the second and third switches SW2 and SW3 may be closed in operation S250. As described above, the sensing operation may be finished with the first and second feedback operations.

For example, when the bit line sense amplifier 150 performs the first feedback operation, the third switch SW3 may be closed. When the third switch SW3 is closed, the second signal SG2 may be used as a negative input of the differential amplifier 151. When the second signal SG2 is used as the negative input of the differential amplifier 151, pull-up current may be applied to the input signal IN. In other words, the magnitude of a signal input as the negative input of the differential amplifier 151 may increase, and accordingly, the magnitude of the first signal SG1 may also increase. According to the present embodiment, the bit line sense amplifier 150 may perform positive feedback, which increases the magnitude of the first signal SG1, through the procedure described with reference to FIG. 8. Accordingly, the first feedback operation may correspond to a positive feedback operation that increases the magnitude of the first signal SG1.

When the bit line sense amplifier 150 performs the second feedback operation, the second and third switches SW2 and SW3 may be closed. When the second and third switches SW2 and SW3 are closed, the first signal SG1 may be the positive input of the differential amplifier 151, and the second signal SG2 may be the negative input of the differential amplifier 151. When the first signal SG1 is the positive input of the differential amplifier 151 and the second signal SG2 is the negative input of the differential amplifier 151, pull-up current may be applied to the input signal IN. In other words, the magnitude of the first signal SG1, i.e., an output signal of the differential amplifier 151, may increase. According to the present embodiment, the bit line sense amplifier 150 may perform positive feedback, which increases the magnitude of the first signal SG1, through the procedure described with reference to FIG. 9. Accordingly, the second feedback operation may correspond to a positive feedback operation that increases the magnitude of the first signal SG1.

Figure 13:
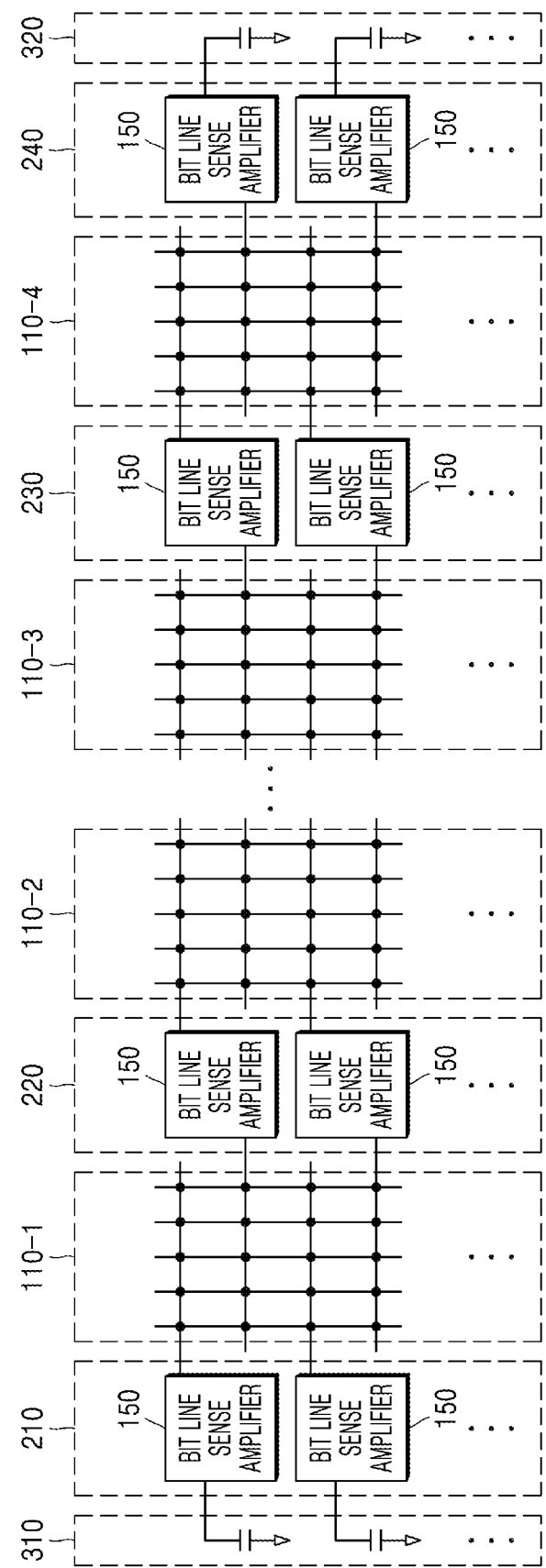
FIGS. 13 and 14 illustrate examples of using a memory device, according to embodiments.
Figure 14:
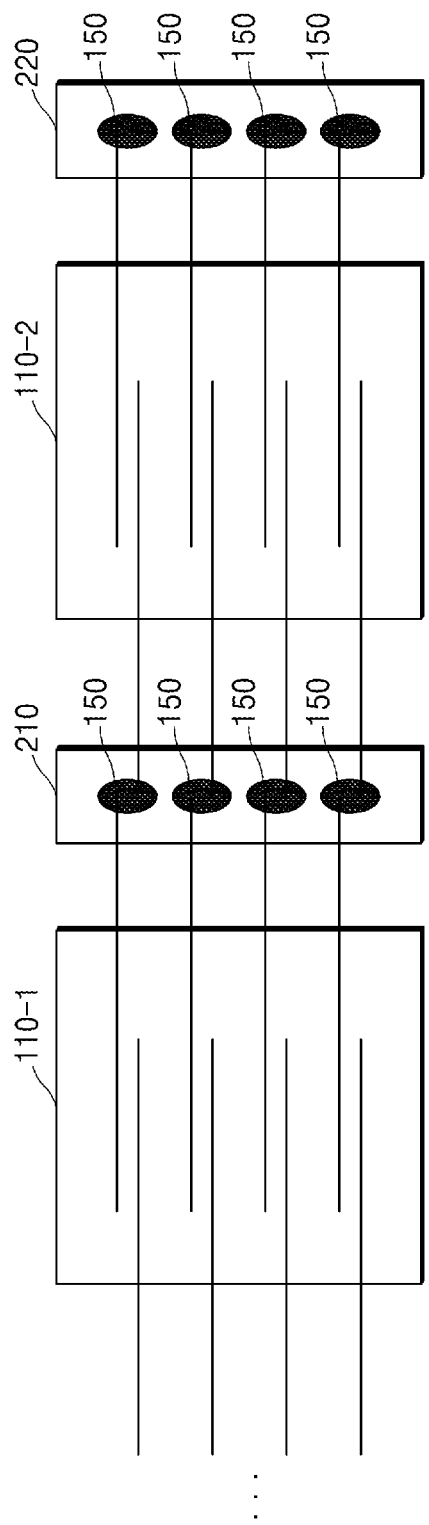

FIGS. 13 and 14 illustrate examples of using a memory device, according to embodiments.

Referring to FIGS. 13 and 14, the memory device 100 may include a plurality of memory cell array blocks 110-1, 110-2, 110-3, and 110-4 and a plurality of bit line sense amplifier blocks 210, 220, 230, and 240 and may further include capacitor blocks 310 and 320. Each of the bit line sense amplifier blocks 210, 220, 230, and 240 may include a plurality of bit line sense amplifiers 150, and each of the memory cell array blocks 110-1, 110-2, 110-3, and 110-4 may include an array of a plurality of memory cells. Each of the capacitor blocks 310 and 320 may include a plurality of capacitors. The capacitors may be provided to prevent capacitance imbalance between a bit line and a complementary bit line and may be referred to as balance capacitors.

Each of the bit line sense amplifier blocks 210, 220, 230, and 240 may be arranged between two adjacent ones of the memory cell array blocks 110-1, 110-2, 110-3, and 110-4 and connected to respective bit lines of the two adjacent memory cell array blocks. Each of the bit line sense amplifiers 150 included in the bit line sense amplifier blocks 210 and 240 respectively at opposite ends may be connected to a bit line of the memory cell array block 110-1 or 110-4 at one side and connected to a capacitor of the capacitor block 310 or 320 at an opposite side to prevent capacitance imbalance. Alternatively, to prevent capacitance imbalance, each of the bit line sense amplifiers 150 may be connected to a bit line including dummy cells. As described above, when two bit lines respectively at opposite sides are connected to each bit line sense amplifier 150 and one of the two bit lines is a complementary bit line, i.e., a reference bit line, of the other bit line, the structure of the bit line sense amplifier 150 may be referred to as an open bit line sense amplifier structure.

At this time, which of the first to third switches SW1, SW2, and SW3 of the bit line sense amplifier 150 is closed may be determined according to whether a memory cell array block to be sensed is an odd-numbered or even-numbered block. However, the method described above is just an example, and embodiments are not limited thereto. It will be understood by one of ordinary skill in the art that various changes may be made in the embodiments.

FIG. 14 illustrates that bit line sense amplifiers 150 are connected as single-ended sense amplifiers in the structure of the memory device 100 described above. Referring to FIG. 14, each of the bit line sense amplifier blocks 210 and 220 may include a plurality of bit line sense amplifiers 150. Here, the bit line sense amplifier block 210 may be connected to a plurality of memory cell array blocks, e.g., the memory cell array blocks 110-1 and 110-2, and the bit line sense amplifier block 220 may be connected to a single memory cell array block, e.g., the memory cell array block 110-2. In other words, each bit line sense amplifier 150 may be configured as a single-ended sense amplifier and may perform a sensing operation even on a dummy line of an edge memory cell. A structure in which the bit line sense amplifier 150 is connected to a memory cell block, according to an embodiment, is described in detail with reference to FIGS. 15 and 16.

Figure 15:
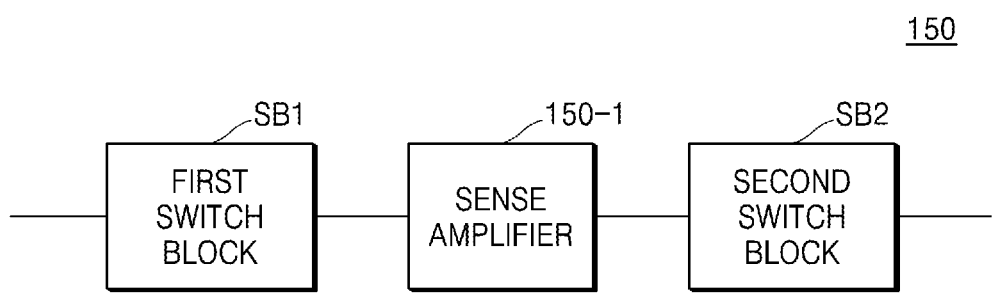
FIG. 15 is a block diagram illustrating an example of using a bit line sense amplifier, according to an embodiment.
Figure 16:
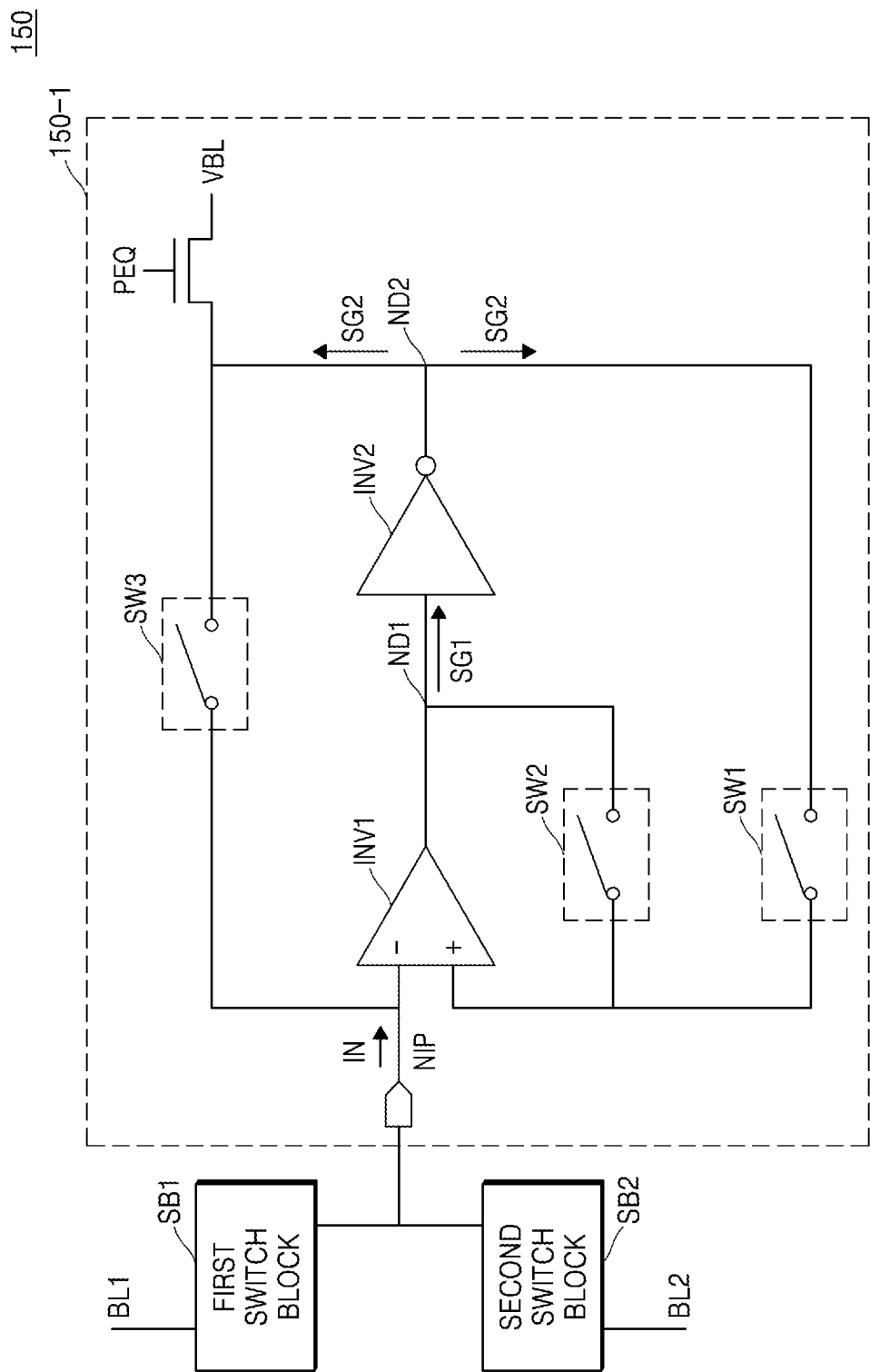
FIG. 16 is a circuit diagram illustrating an example of using a bit line sense amplifier, according to an embodiment.

FIG. 15 is a block diagram illustrating an example of using the bit line sense amplifier 150, according to an embodiment. FIG. 16 is a circuit diagram illustrating an example of using the bit line sense amplifier 150, according to an embodiment.

Referring to FIG. 15, the bit line sense amplifier 150 may include a sense amplifier 150-1 and a switch unit. Here, the switch unit may include a first switch block SB1 and a second switch block SB2. The first switch block SB1 and the second switch block SB2 may include a plurality of switches connected to the bit lines BL.

According to an embodiment, the sense amplifier 150-1 may correspond to the bit line sense amplifier 150 described with reference to FIGS. 1 to 14.

Referring to FIGS. 15 and 16, the first switch block SB1 and the second switch block SB2 may be connected to an input terminal NIP of the sense amplifier 150-1 and may select the input signal IN input to the sense amplifier 150-1.

Referring to FIGS. 14 to 16, the first switch block SB1 and the second switch block SB2 may be connected to the input terminal NIP of the sense amplifier 150-1 and may determine from which of the memory cell array blocks 110-1 and 110-2 a bit line signal is input to the sense amplifier 150-1. For convenience of description, assuming that the first switch block SB1 is connected to the memory cell array block 110-1 and the second switch block SB2 is connected to the memory cell array block 110-2, the first switch block SB1 may be closed such that the sense amplifier 150-1 receives a signal from the memory cell array block 110-1. Similarly, the second switch block SB2 may be closed such that the sense amplifier 150-1 receives a signal from the memory cell array block 110-2. In other words, because the bit line sense amplifier 150 may be configured as a single-ended sense amplifier, a signal input to the sense amplifier 150-1 may be selected by the switch unit.

According to an embodiment, the sense amplifier 150-1 may be connected to a single memory cell array block. For example, the sense amplifier 150-1 may be connected to dummy lines of memory cells in an edge region. When the sense amplifier 150-1 is connected to the memory cells in the edge region, the switches of the second switch block SB2 may be closed. Here, a memory block without dummy lines may be defined as a first memory block, and a memory block with dummy lines may be defined as a second memory block. In addition, a switch block including switches connected to the first memory block may be defined as the first switch block SB1, and a switch block including switches connected to the second memory block may be defined as the second switch block SB2. The first switch block SB1 and the second switch block SB2 may include select switches, which may select at least one of the bit lines BL. When one of the select switches is closed, a sensing operation may be performed on each bit line BL. For example, when the input terminal NIP is connected to the first memory block, switches of the first switch block SB1 may be closed. When the input terminal NIP is connected to the second memory block, switches of the second switch block SB2 may be closed. When switches of the first or second switch block SB1 or SB2 are closed and the first to third switches SW1, SW2, and SW3 of the sense amplifier 150-1 are opened, the sense amplifier 150-1 may perform a sensing operation on bit lines of a selected memory block.

According to an embodiment, the sense amplifier 150-1 may be configured as a single-ended sense amplifier and thus be connected to dummy lines of memory cells in an edge region and may be connected to a plurality of memory blocks through the first switch block SB1 and the second switch block SB2.

According to an embodiment, INV1 and INV2 may include a differential amplifier 151 and sensing inverter 152 described with reference to FIG. 2.

Figure 17:
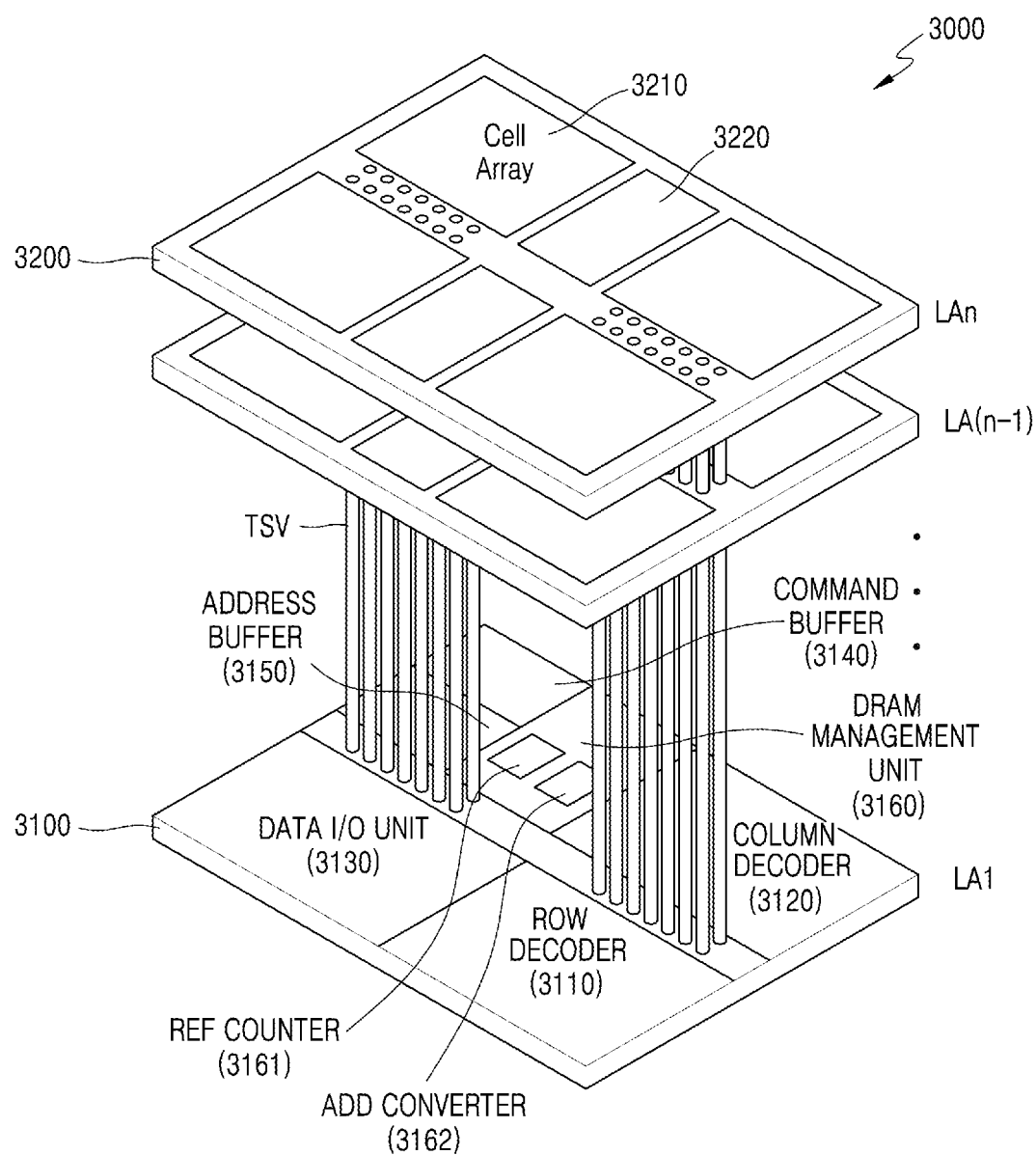
FIG. 17 is a structural diagram illustrating an implementation of a semiconductor memory device, according to embodiments.

FIG. 17 is a structural diagram illustrating an implementation of a semiconductor memory device 3000, according to embodiments.

As shown in FIG. 17, the semiconductor memory device 3000 may include a plurality of semiconductor layers LA1 to LAn. Each of the semiconductor layers LA1 to LAn may correspond to a memory chip including DRAM cells. Some of the semiconductor layers LA1 to LAn may be master chips interfacing with an external controller, and the others of the semiconductor layers LA1 to LAn may be slave chips storing data. In the example of FIG. 17, the semiconductor layer LA1 at the bottom is assumed to be a master chip, and the other semiconductor layers LA2 to LAn are assumed to be slave chips.

The semiconductor layers LA1 to LAn may exchange signals with one another via a through silicon via (TSV). The master chip, i.e., the semiconductor layer LA1, may communicate with an external memory controller (not shown) through a conductive unit (not shown) formed on an outer surface of the master chip. The configuration and operations of the semiconductor memory device 3000 are described below, focusing on a first semiconductor layer 3100 as a master chip and an n-th semiconductor layer 3200 as a slave chip.

The first semiconductor layer 3100 may include various circuits to drive a cell array 3210 included in each slave chip. For example, the first semiconductor layer 3100 may include a row decoder 3110 driving a word line of the cell array 3210, a column decoder 3120 driving a bit line of the cell array 3210, a data I/O unit 3130 controlling data I/O, a command buffer 3140 receiving a command CMD external to the semiconductor memory device 3000, and an address buffer 3150 receiving and buffering an address ADDR external to the semiconductor memory device 3000.

The first semiconductor layer 3100 may further include a DRAM management unit 3160 managing the memory operations of the slave chip. The n-th semiconductor layer 3200 may include the cell array 3210 and a peripheral circuit region 3220, in which peripheral circuits driving the cell array 3210 may be arranged. For example, a row/column selector (not shown) selecting a row and a column of the cell array 3210, a bit line sense amplifier, and the like may be arranged in the peripheral circuit region 3220. At this time, the bit line sense amplifier may include the bit line sense amplifier 150 according to the embodiments described above. Therefore, an offset of inverters of the bit line sense amplifier may be compensated for, and accordingly, sensing sensitivity with respect to a bit line may be increased.

Figure 18:
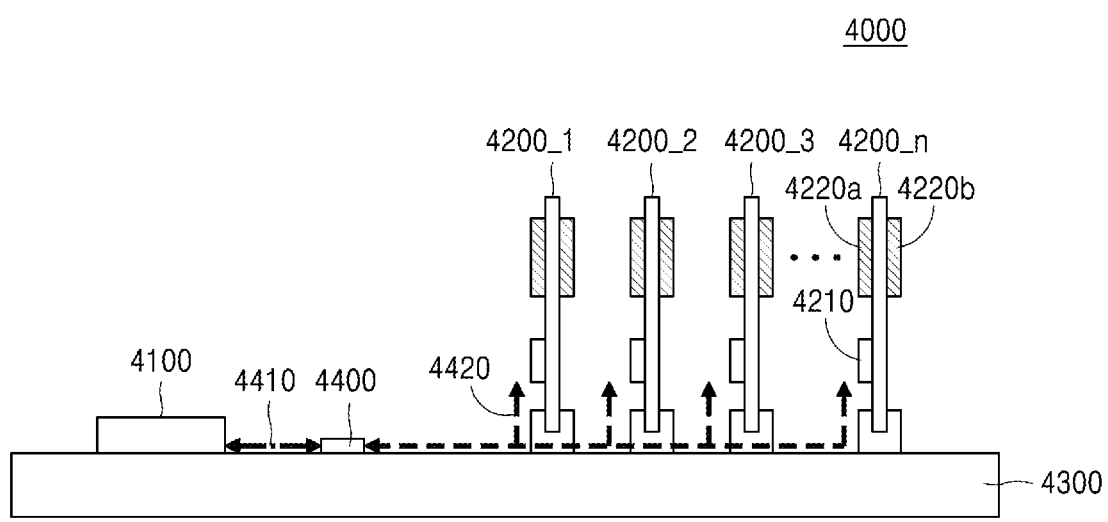
FIG. 18 is a structural diagram illustrating an example of a server system including a semiconductor memory device, according to embodiments.

FIG. 18 is a structural diagram illustrating an example of a server system 4000 including a semiconductor memory device, according to embodiments.

The server system 4000 of FIG. 18 may include a memory controller 4100 and a plurality of memory modules 4200_1 to 4200_n. Each of the memory modules 4200_1 to 4200_n may include memory blocks 4220a and 4220b constituted of memory chips. For example, the memory blocks 4220a and 4220b may be constituted of DRAM chips.

The bit line sense amplifier 150, the sense amplifier 150-1, the memory device 100, or the semiconductor memory device 3000, according to the embodiments described above, may be applied to the memory modules 4200_1 to 4200_n. Therefore, an offset of inverters of a bit line sense amplifier may be compensated for, and accordingly, sensing efficiency with respect to a bit line may be increased.

It is illustrated in FIG. 18 that the server system 4000 has a single-channel structure, in which the memory controller 4100 and the memory modules 4200_1 to 4200_n are mounted on one circuit board 4300. However, this is just an example, and embodiments are not limited thereto. The server system 4000 may be designed in various structures including a multi-channel structure, in which sub-boards having memory modules mounted thereon are coupled to sockets of a main board having the memory controller 4100 mounted thereon.

Transmission of signals of the memory modules 4200_1 to 4200_n may be performed via optical I/O connection. The server system 4000 may further include an electrical-to-optical converter 4400, and each of the memory modules 4200_1 to 4200_n may further include an optical-to-electrical converter 4210. According to an embodiment, the electrical-to-optical converter 4400 may be embedded in the memory controller 4100.

The memory controller 4100 may be connected to the electrical-to-optical converter 4400 through an electrical channel 4410. Accordingly, the memory controller 4100 may exchange signals with the electrical-to-optical converter 4400 through the electrical channel 4410.

The electrical-to-optical converter 4400 may convert an electrical signal received from the memory controller 4100 into an optical signal and transmit the optical signal to an optical channel 4420 and may convert an optical signal received from the optical channel 4420 into an electrical signal and transmit the electrical signal to the electrical channel 4410.

The memory modules 4200_1 to 4200_n may be connected to the electrical-to-optical converter 4400 through the optical channel 4420. An optical signal transmitted through the optical channel 4420 may be applied to the optical-to-electrical converter 4210 included in each of the memory modules 4200_1 to 4200_n. The optical-to-electrical converter 4210 may convert an optical signal into an electrical signal and transmit the electrical signal to each of the memory blocks 4220a and 4220b. An electrical signal generated by each of the memory blocks 4220a and 4220b may be converted into an optical signal by the optical-to-electrical converter 4210.

As described above, signal transmission between the memory controller 4100 and the memory modules 4200_1 to 4200_n of the server system 4000 may be performed via optical I/O connection through the optical channel 4420.

Figure 19:
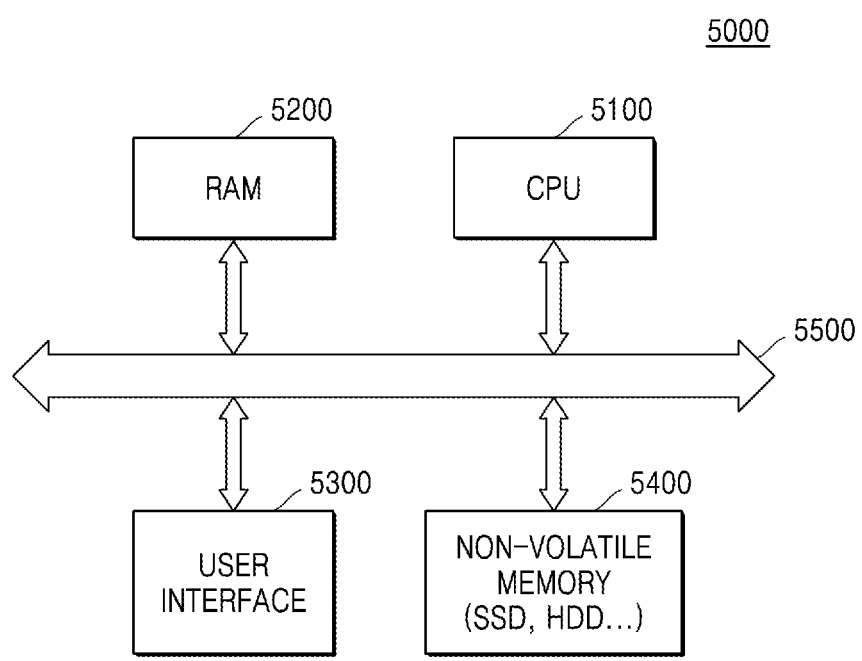
FIG. 19 is a block diagram of a computing system including a memory device, according to embodiments.

FIG. 19 is a block diagram of a computing system 5000 including a memory device, according to embodiments.

A semiconductor memory device of the inventive concept may be mounted, as RAM 5200, on an information processing system, such as a mobile device or a desktop computer. The semiconductor memory device may be applied to the RAM 5200 or may be used as a memory module. The RAM 5200 in FIG. 19 may include a memory device and a memory controller.

According to an embodiment, the computing system 5000 may include a central processing unit (CPU) 5100, the RAM 5200, a user interface 5300, and a non-volatile memory 5400, which are electrically connected to a bus 5500. The non-volatile memory 5400 may include a high-capacity storage device, such as a solid-state drive (SSD) or a hard disk drive (HDD).

The RAM 5200 of the computing system 5000 may include a DRAM chip (not shown) including DRAM cells storing data. The bit line sense amplifier 150 or the sense amplifier 150-1, according to an embodiment, may be provided in the DRAM chip. Accordingly, sensing efficiency of data stored in the DRAM chip may be increased.

While the inventive concept has been particularly shown and described with reference to embodiments thereof, it will be understood that various changes in form and details may be made therein without departing from the scope of the following claims.

What is claimed is:

1. A bit line sense amplifier comprising:
a differential amplifier configured to receive an input signal from a bit line through an input terminal of the bit line sense amplifier and output a first signal to a first node of the bit line sense amplifier;
a sensing inverter configured to receive the first signal and output a second signal to a second node of the bit line sense amplifier, the second signal resulting from inverting the first signal;
a first switch configured to electrically connect the second node to a positive input of the differential amplifier;
a second switch configured to electrically connect the first node to the positive input of the differential amplifier; and
a third switch configured to electrically connect the second node to a negative input of the differential amplifier,
wherein, when the first switch is closed, the input signal is configured to be input to the negative input of the differential amplifier, the second signal is configured to be input to the positive input of the differential amplifier, and the bit line sense amplifier is configured to perform offset compensation on the first signal, based on the input signal and the second signal.

2. The bit line sense amplifier of claim 1, further comprising a fourth switch configured to electrically connect a power supply external to the bit line sense amplifier to the input terminal of the bit line sense amplifier,
wherein, when the fourth switch is closed, the bit line sense amplifier is configured to be supplied with a precharge voltage from the power supply and perform a precharge operation.

3. The bit line sense amplifier of claim 1, wherein, when the third switch is closed, the second signal is configured to be input to the negative input of the differential amplifier, and the differential amplifier is configured to perform a first feedback operation on the first signal, based on the input signal and the second signal.

4. The bit line sense amplifier of claim 3, wherein, when the first switch, the second switch, and the third switch are all opened, the bit line sense amplifier is configured to start a bit line sensing operation based on the input signal.

5. The bit line sense amplifier of claim 4, wherein, when the second switch is closed, the first signal is configured to be input to the positive input of the differential amplifier and the bit line sense amplifier is configured to perform the bit line sensing operation based on an output of the differential amplifier.

6. The bit line sense amplifier of claim 4, wherein, when the second switch and the third switch are closed, the bit line sense amplifier is configured to perform a second feedback operation on the first signal.

7. The bit line sense amplifier of claim 5, wherein, when the third switch is closed, the bit line sense amplifier is configured to perform restoration of a memory cell.

8. A bit line sensing method performed by a bit line sense amplifier including a first switch electrically connecting an output of a sensing inverter to a positive input of a differential amplifier, a second switch electrically connecting an output of the differential amplifier to the positive input of the differential amplifier, and a third switch electrically connecting the output of the sensing inverter to a negative input of the differential amplifier, the bit line sensing method comprising:
inputting an input signal from a bit line to the differential amplifier through an input terminal of the bit line sense amplifier and outputting a first signal to a first node of the bit line sense amplifier;
generating, by the sensing inverter, a second signal by inverting the first signal and outputting the second signal from the sensing inverter to a second node of the bit line sense amplifier; and
inputting the input signal to the negative input of the differential amplifier, inputting the second signal to the positive input of the differential amplifier, and performing offset compensation on the first signal, based on the input signal and the second signal, while the first switch is closed.

9. The bit line sensing method of claim 8, further comprising:
performing a precharge operation by closing a fourth switch that electrically connects a power supply to the input terminal of the bit line sense amplifier, wherein the power supply is external to the bit line sense amplifier and provides the bit line sense amplifier with a precharge voltage while the fourth switch is closed.

10. The bit line sensing method of claim 8, further comprising inputting the second signal to the negative input of the differential amplifier and performing a first feedback operation on the first signal, based on the input signal and the second signal, while the third switch is closed.

11. The bit line sensing method of claim 10, further comprising starting a bit line sensing operation, based on the input signal, while the first switch, the second switch, and the third switch are all open.

12. The bit line sensing method of claim 11, further comprising inputting the first signal to the positive input of the differential amplifier and performing the bit line sensing operation, based on the output of the differential amplifier, while the second switch is closed.

13. The bit line sensing method of claim 11, further comprising performing a second feedback operation on the first signal while the second switch and the third switch are closed.

14. The bit line sensing method of claim 12, further comprising performing restoration of a memory cell while the third switch is closed.

15. The bit line sensing method of claim 14, further comprising performing a precharge operation of the bit line sense amplifier after the restoration is completed.

16. A bit line sense amplifier comprising:
a differential amplifier configured to receive an input signal from a bit line through an input terminal of the bit line sense amplifier and output a first signal to a first node of the bit line sense amplifier;
a sensing inverter configured to receive the first signal and output a second signal to a second node of the bit line sense amplifier, the second signal resulting from inverting the first signal;
a first switch configured to electrically connect the second node to a positive input of the differential amplifier;
a second switch configured to electrically connect the first node to the positive input of the differential amplifier;
a third switch configured to electrically connect the second node to a negative input of the differential amplifier; and
a switch unit configured to electrically connect the input terminal to a plurality of bit lines,
wherein, when the first switch is closed, the input signal is configured to be input to the negative input of the differential amplifier, the second signal is configured to be input to the positive input of the differential amplifier, and the bit line sense amplifier is configured to perform offset compensation on the first signal, based on the input signal and the second signal.

17. The bit line sense amplifier of claim 16, wherein the switch unit includes:
a first switch block configured to electrically connect to a first memory block that does not include dummy lines; and a second switch block configured to electrically connect to a second memory block that includes dummy lines.

18. The bit line sense amplifier of claim 17, wherein the first switch block includes select switches configured to select at least one of the plurality of bit lines, and the bit line sense amplifier is configured to perform a bit line sensing operation when one of the select switches is closed.

19. The bit line sense amplifier of claim 17, wherein the switch unit is configured to close switches of the second switch block when the input terminal is connected to the second memory block.

20. The bit line sense amplifier of claim 17, wherein, when switches of the second switch block are closed and the first switch, the second switch, and the third switch are all opened,
the bit line sense amplifier is configured to start a sensing operation on the second memory block.

* * * * *